United States Patent [19]

Yamada et al.

[11] Patent Number: 4,855,613

[45] Date of Patent: Aug. 8, 1989

[54] WAFER SCALE INTEGRATION SEMICONDUCTOR DEVICE HAVING IMPROVED CHIP POWER-SUPPLY CONNECTION ARRANGEMENT

[75] Inventors: Michihiro Yamada; Hiroshi Miyamoto, both of Hyogo, Japan

[73] Assignee: Mitsubishi Denki Kabushiki Kaisha, Tokyo, Japan

[21] Appl. No.: 144,383

[22] Filed: Jan. 15, 1988

[30] Foreign Application Priority Data

May 8, 1987 [JP] Japan .................................. 62-112908
Jun. 1, 1987 [JP] Japan .................................. 62-138532

[51] Int. Cl.$^4$ ...................... H04Q 9/00; G11C 17/00; H03K 17/08; H03K 19/007
[52] U.S. Cl. .................................. 307/202.1; 307/441; 307/296.1; 307/296.3; 307/482.1; 307/303.2; 340/825.84; 365/96
[58] Field of Search ...................... 307/202.1, 441, 443, 307/296.1, 296.3, 303.1, 303.2, 465.1, 482.1, 468, 469, 448, 451, ; 357/45; 340/825.83, 825.84; 365/96, 103, 104, 226

[56] References Cited

U.S. PATENT DOCUMENTS

| | | | |
|---|---|---|---|
| 3,937,936 | 2/1976 | Saporito et al. | 307/441 X |
| 4,329,685 | 5/1982 | Mahon et al. | 340/825.84 |
| 4,605,872 | 8/1986 | Rung | 307/441 X |
| 4,613,959 | 9/1986 | Jiang | 307/441 X |
| 4,621,346 | 11/1986 | McAdams | 307/441 X |
| 4,686,384 | 8/1987 | Harvey et al. | 340/825.84 X |
| 4,694,432 | 9/1987 | Miyatake et al. | 307/441 X |
| 4,701,636 | 10/1987 | Millhollan et al. | 307/202.1 X |

OTHER PUBLICATIONS

ISCC 79, "A 1Mb Full Wafer MOS RAM", by Yutaka Egawa et al., Wednesday, Feb. 14, 1979, pp. 18-19.
IEEE J. of Sol. St. Circuits, "A 1-Mbit Full-Wafer MOS RAM", vol. SC-15, No. 4, Aug. 1980, pp. 677-686.

*Primary Examiner*—Stanley D. Miller
*Assistant Examiner*—David R. Bertelson
*Attorney, Agent, or Firm*—Lowe, Price, LeBlanc, Becker & Shur

[57] ABSTRACT

A plurality of RAM chips, a $V_{CC}$ power supply terminal and a $V_{SS}$ power supply terminal are all formed on one wafer. Each of the RAM chips comprises an MOS circuit comprising a $V_{CC}$ power supply line and a $V_{SS}$ power supply line, a power supply terminal and a ground terminal. The ground terminal is connected to the $V_{SS}$ power supply line through an N channel MOS transistor, and the power supply terminal is connected to the $V_{CC}$ power supply line. The MOS transistor has a gate connected to a power supply terminal through a fuse element. The power supply terminals and the ground terminals in the plurality of RAM chips are connected to the $V_{CC}$ power supply terminal and the $V_{SS}$ power supply terminal, respectively, by aluminum interconnections. When a power-supply voltage is applied between the $V_{CC}$ power supply terminal and the $V_{SS}$ power supply terminal, the MOS transistor in each of the RAM chips is turned on, so that the power-supply voltage is supplied to the MOS circuit in each of the RAM chips. When a fuse element in any of the RAM chips is disconnected, the MOS transistor in the RAM chip is turned off, so that the power-supply voltage is not supplied to the MOS circuit in the RAM chip and the power-supply voltage is supplied to the MOS circuits in the other RAM chips.

18 Claims, 6 Drawing Sheets

WAFER SCALE INTEGRATION SEMICONDUCTOR DEVICE HAVING IMPROVED CHIP POWER-SUPPLY CONNECTION ARRANGEMENT

BACKGROUND OF THE INVENTION

1. Field of the Invention

The present invention relates to a wafer scale integration semiconductor device (referred to as WSI semiconductor device hereinafter) comprising a plurality of semiconductor circuit chips all integrated on one wafer and more particularly, to a circuit for supplying a power-supply voltage to each of the semiconductor circuit chips.

2. Description of the Prior Art

As an example of a WSI semiconductor device, a Full-Wafer MOS RAM is described in IEEE JOURNAL OF SOLID STATE CIRCUITS, VOL. SC-15, NO. 4, AUGUST 1980 and DIGEST OF TECHNICAL PAPERS in ISSCC 79, pp. 18–19.

FIG. 1 is a diagram showing a structure of a Full-Wafer MOS RAM (Metal Oxide Semiconductor Random Access Memory).

Referring to FIG. 1, a lot of RAM chips 2 are formed on a wafer 1. Each of the RAM chips 2 comprises a $V_{CC}$ power supply line coupled to a power-supply voltage $V_{CC}$ and a $V_{SS}$ power supply line coupled to a ground voltage $V_{SS}$. The $V_{CC}$ power supply lines in the RAM chips 2 are coupled to each other by an aluminum interconnection 3 and connected to a $V_{CC}$ power supply terminal 4. The $V_{SS}$ power supply lines in the RAM chips 2 are coupled to each other by an aluminum interconnection 5 and connected to a $V_{SS}$ power supply terminal 6. In addition, each of the RAM chips 2 comprises an address line and a control line. The address line and the control line in each of the RAM chips 2 are coupled to each other by another interconnection (not shown) and connected to a common address terminal and a common control terminal, respectively.

FIG. 2 is a diagram showing one of the RAM chips 2 shown in FIG. 1.

Referring to FIG. 2, an MOS circuit 7 constituting a RAM (Random Access Memory) is formed on the RAM chip 2. In addition, a power supply terminal 8 coupled to a power supply voltage $V_{CC}$ and a ground terminal 9 coupled to a ground voltage are formed on the RAM chip 2. The power supply terminal 8 is connected to the MOS circuit 7 through a $V_{CC}$ power supply line 10, and the ground terminal 9 is connected to the MOS circuit 7 through a $V_{SS}$ power supply line 11.

In the above described Full-Wafer MOS RAM, when the power-supply voltage $V_{CC}$ is applied between the $V_{CC}$ power supply terminal 4 and the $V_{CC}$ power supply terminal 6, the power-supply voltage $V_{CC}$ is applied to each of the RAM chips 2 through the aluminum interconnections 3 and 5, so that each of the MOS circuits 7 is operated.

However, in the above described conventional WSI semiconductor device, if and when an electrically short-circuited state as represented by a resistor 12 exists between the $V_{CC}$ power supply line 10 and the $V_{SS}$ power supply line 11 in one of the RAM chips 2 on the wafer 1, excessive short-circuit current flows in the RAM chip 2. Therefore, the power-supply voltage drops, so that a power-supply voltage at a normal level is not applied to the other normal RAM chips 2. Furthermore, if the power-supply voltage continues to be applied to one of the RAM chips 2 on the wafer 1 with the electrically short-circuited state existing, an external power supply which applies the power-supply voltage is destroyed. Thus, if one of the semiconductor circuit chips on the wafer is defective, the entire WSI semiconductor device can not be used.

SUMMARY OF THE INVENTION

A primary object of the present invention is to provide a WSI semiconductor device capable of easily preventing excessive short-circuit current from flowing for a long time even if an electrical short-circuited state exists between power supply lines in any of a plurality of semiconductor circuit chips on a wafer.

In order to attain the above described object, a wafer scale integration semiconductor device according to the present invention comprises a semiconductor wafer, a plurality of semiconductor circuit chips formed on the semiconductor wafer, a first common power supply terminal formed on the semiconductor wafer and coupled to a first power-supply voltage at a high level, a second common power supply terminal formed on the semiconductor wafer and coupled to a second power-supply voltage at a low level, a first common power supply interconnection connected between the first common power supply terminal and the plurality of semiconductor circuit chips, and a second common power supply interconnection connected between the second power supply terminal and the plurality of semiconductor circuit chips, each of the semiconductor circuit chips comprising an internal circuit comprising a first chip power supply interconnection and a second chip power supply interconnection, a first chip power supply terminal for supplying the first power-supply voltage applied from the first common power supply interconnection to the first chip power supply interconnection, a second chip power supply terminal for supplying the second power-supply voltage applied from the second common power supply interconnection to the second chip power supply interconnection, switching means connected between the first chip power supply terminal and the first chip power supply interconnection and/or between the second chip power supply terminal and the second chip power supply interconnection, and switching control means including fuse means for rendering the switching means conductive when the fuse mans is not disconnected and rendering the switching means non-conductive when the fuse means is disconnected.

In the WSI semiconductor device according to the present invention, when a power-supply voltage is applied between the first common power supply terminal and the second common power supply terminal, the power-supply voltage is applied between the first chip power supply interconnection and the second chip power supply interconnection in each of the semiconductor circuit chips through the first common power supply interconnection and the second common power supply interconnection. In each of the semiconductor circuit chips, when the fuse means is not disconnected, the switching means is rendered conductive, so that the power-supply voltage is supplied to the internal circuit through the first chip power supply interconnection and the second chip power supply interconnection. In any of the semiconductor circuit chips, if and when an electrically short-circuited state exists between the first chip power supply interconnection and the second chip power supply interconnection, the switching means is rendered non-conductive if the fuse means in the semiconductor circuit chips is externally disconnected by predetermined means. Therefore, the power-supply voltage is not supplied to the internal circuit in the semiconductor circuit chips.

Therefore, in accordance with the present invention, when an electrically short-circuited state exists in any of the plurality of the semiconductor circuit chips on the wafer, the short-circuit current is prevented from flowing and a normal power-supply voltage is supplied to the other semiconductor circuit chips if the fuse means in the semiconductor circuit chip is disconnected.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
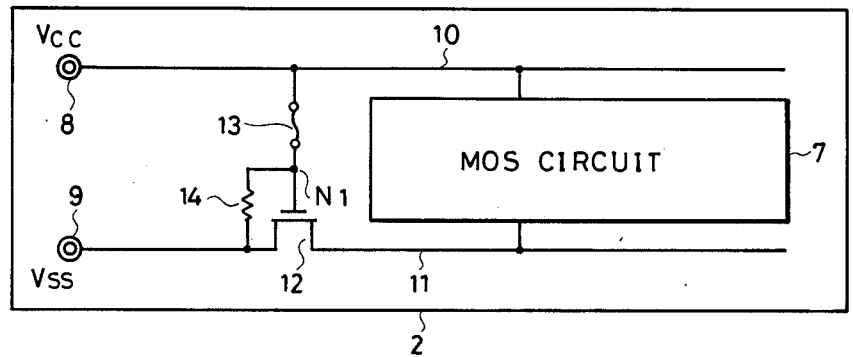
FIG. 3 is a circuit diagram showing one of semiconductor circuit chips included in a WSI semiconductor device according to a first embodiment of the present invention.

FIG. 3 is a circuit diagram showing one of semiconductor circuit chips included in a WSI semiconductor device according to a first embodiment of the present invention.

An MOS circuit 7 constituting a RAM, a power supply terminal 8 coupled to a power-supply voltage $V_{CC}$ and a ground terminal 9 coupled to a ground voltage $V_{SS}$ are formed on a RAM chip 2. The power supply terminal 8 is connected to the MOS circuit 7 through a $V_{CC}$ power supply line 10 of an aluminum interconnection. The ground terminal 9 is connected to the MOS circuit 7 through a $V_{SS}$ power supply line 11 of an aluminum interconnection through an N channel MOS transistor 12 serving as switching means. More specifically, the MOS transistor 12 has a source connected to the ground terminal 9 and a drain connected to the $V_{SS}$ power supply line 11. The MOS transistor 12 has a gate connected to a node N1. A fuse element 13 is connected between the node N1 and the $V_{CC}$ power supply line 10. The fuse element 13 is formed by, for example, polysilicon (polycrystalline silicon) and aluminum, and is disconnected by irradiation of laser beams or flow of excessive current. In addition, a resistor 14 serving as holding means is connected between the node N1 and the ground terminal 9. The resistor 14 has a sufficiently high resistance value. Therefore, the amount of current flowing from the power supply terminal 8 to the ground terminal 9 through the fuse element 13 and the resistor 14 is limited to an extremely small value by the large resistance value of the resistor 14.

Figure 1:
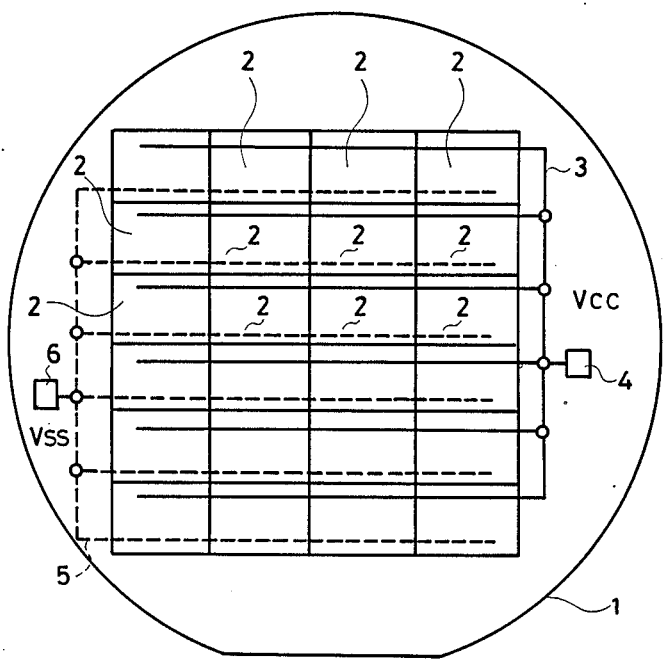
FIG. 1 is a schematic plan view of a WSI semiconductor device comprising a plurality of semiconductor circuit chips all formed on one wafer, where a $V_{CC}$ power supply interconnection and a $V_{SS}$ power supply interconnection are illustrated.
Figure 2:
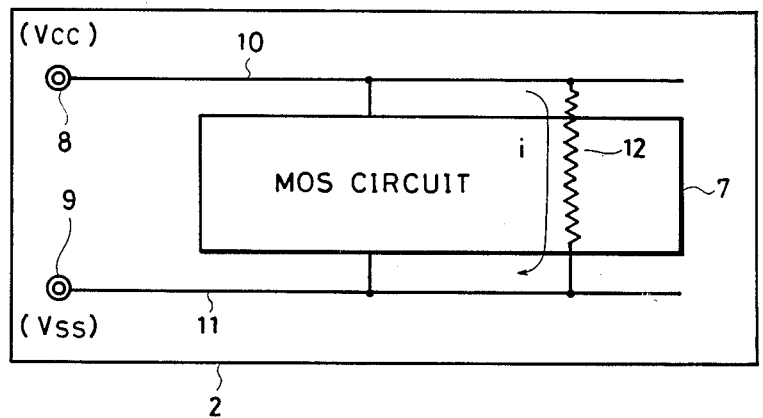
FIG. 2 is a circuit diagram showing one of semiconductor circuit chips included in the conventional WSI semiconductor device, where an electrically short-circuited state exists between a power supply line and a grounding conductor.

A plurality of RAM chips 2 shown in FIG. 3 are all formed on one wafer 1 as shown in FIG. 1. Power supply terminals 8 in the RAM chips 2 are coupled to each other by an aluminum interconnection 3 and connected to a $V_{CC}$ power supply terminal 4. Ground terminals 9 in the RAM chips 2 are coupled to each other by an aluminum interconnection 5 and connected to a $V_{SS}$ power supply terminal 6. When a power-supply voltage $V_{CC}$ is applied between the $V_{CC}$ power supply terminal 4 and the $V_{SS}$ power supply terminal 6, the power-supply voltage $V_{CC}$ is applied between the power supply terminal 8 and the ground terminal 9 in each of the RAM chips 2 through the aluminum interconnections 3 and 5.

In each of the RAM chips 2, in an ordinary case in which the fuse element 13 is not disconnected, a potential at an approximately $V_{CC}$ level is applied to the gate of the MOS transistor 12 if the power-supply voltage $V_{CC}$ is applied between the power supply terminal 8 and the ground terminal 9. Therefore, the MOS transistor 12 is turned on. As a result, the ground terminal 9 and the $V_{SS}$ power supply line 11 are electrically connected to each other. Thus, a potential at a $V_{SS}$ level is applied to the $V_{SS}$ power supply line 11 without any loss of voltage, and the power-supply voltage $V_{CC}$ is applied between the $V_{CC}$ power supply line 10 and the $V_{SS}$ power supply line 11.

Assuming that the $V_{SS}$ power supply line 11 of an aluminum interconnection has a width of 50 $\mu$m and a length of 10 mm and sheet resistance of aluminum is 50 m$\Omega$/□, the resistance value of the interconnection is 10$\Omega$. Thus, if the channel width of the MOS transistor 12 is set such that the impedance of the transistor 12 is smaller than 10$\Omega$, impedance loss caused by the transistor 12 can be neglected.

In a checking process, the power-supply voltage $V_{CC}$ is applied between the $V_{CC}$ power supply terminal 4 and the $V_{SS}$ power supply terminal 6 on the wafer 1 by a probing stylus. If and when an electrically short-circuited state exists between the $V_{CC}$ power supply line 10 and the $V_{SS}$ power supply line 11 in any of the RAM chips 2, excessive short-circuit current flows in the RAM chip 2. When the short-circuit current is detected by an external tester, the fuse element 13 in the RAM chip 2 is disconnected by, for example, laser beams in response to the detection. As a result, since the potential of the node N1 is fixed at a $V_{SS}$ level by the resistor 14, the potential of the gate of the MOS transistor 12 attains the $V_{SS}$ level, so that the transistor 12 is completely turned off. It is determined by a well-known technique utilizing infrared-rays or by measuring the rise of temperature, for example, which of the RAM chips 2 is a RAM chip having an electrically short-circuited state.

By the above described operation, excessive short-circuit current is prevented from flowing between the $V_{CC}$ power supply terminal 4 and the power supply terminal 6 for a long time, and the current consumption becomes zero in the RAM chip 2. Thus, a power-supply voltage at a normal level is applied to the other normal RAM chips 2. More specifically, even if any of the plurality of RAM chips 2 on the wafer 1 is defective, the other RAM chips are normally operated by disconnecting the fuse element 13 in the defective chip.

Figure 4:
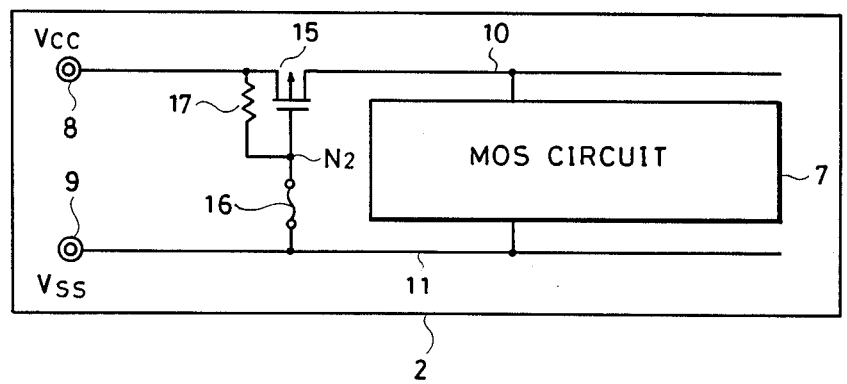
FIG. 4 is a circuit diagram showing one of semiconductor circuit chips included in a WSI semiconductor device according to a second embodiment of the present invention.

FIG. 4 is a circuit diagram showing one of semiconductor circuit chips 2 included in a WSI semiconductor device according to a second embodiment of the present invention.

Referring to FIG. 4, a P channel MOS transistor 15 serving as switching means is connected between a power supply terminal 8 and a $V_{CC}$ power supply line 10. More specifically, the MOS transistor 15 has a source connected to the power supply terminal 8 and a drain connected to the $V_{CC}$ power supply line 10. The MOS transistor 15 has a gate connected to a node N2. A fuse element 16 is connected between the node N2 and a $V_{SS}$ power supply line 11. In addition, a resistor 17 serving as holding means is connected between the node N2 and the power supply terminal 8. The resistor 17 has a sufficiently high resistance value, similarly to the resistor 14 shown in FIG. 3. Therefore, the amount of current flowing from the power supply terminal 8 to a ground terminal 9 through the resistor 17 and the fuse element 16 becomes extremely small.

In the RAM chip 2, when the fuse element 16 is not disconnected, a potential at an approximately $V_{SS}$ level is applied to the gate of the MOS transistor 15 if a power-supply voltage $V_{CC}$ is applied between the power supply terminal 8 and the ground terminal 9. Therefore, the MOS transistor 15 is turned on, so that the power supply terminal 8 and the power supply line 10 are electrically connected to each other. Thus, a potential at $V_{CC}$ level is applied to the $V_{CC}$ power supply line 10 without any voltage loss, and the power-supply voltage $V_{CC}$ is applied between the $V_{CC}$ power supply line 10 and the $V_{SS}$ power supply line 11. In this case, if the channel width of the MOS transistor 15 is set sufficiently large, impedance loss caused by the MOS transistor 15 can be neglected.

On the other hand, when the fuse element 16 is disconnected, the potential of the node N2 is fixed at the $V_{CC}$ level by the resistor 17. Therefore, the potential of the gate of the MOS transistor 15 attains the $V_{CC}$ level, so that the transistor 15 is completely turned off.

Thus, the embodiment shown in FIG. 4 can bring about the same effect as that of the embodiment shown in FIG. 3.

Figure 5:
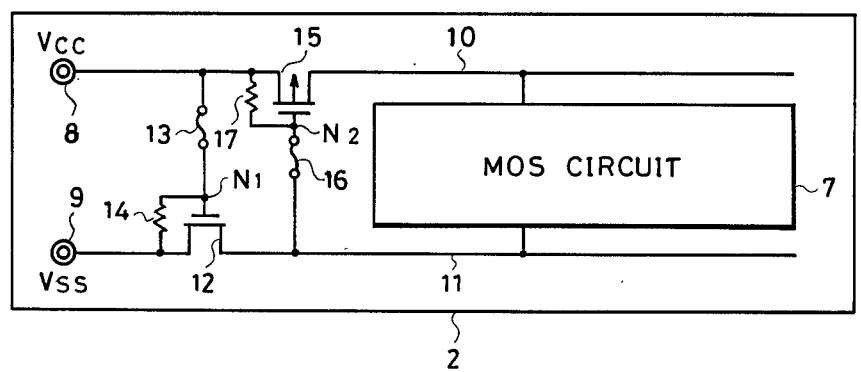
FIG. 5 is a circuit diagram showing one of semiconductor circuit chips included in a WSI semiconductor device according to a third embodiment of the present invention.

FIG. 5 is a circuit diagram of one of semiconductor circuit chips included in a WSI semiconductor device according to a third embodiment of the present invention.

The present embodiment is a combination of the embodiments shown in FIGS. 3 and 4. An N channel MOS transistor 12 is connected between a ground terminal 9 and a $V_{SS}$ power supply line 11, and a P channel MOS transistor 15 is connected between a power supply terminal 8 and a $V_{CC}$ power supply line 10. The MOS transistor 12 has a gate connected to a node N1. A fuse element 13 is connected between the node N1 and the power supply terminal 8. A resistor 14 is connected between the node N1 and the ground terminal 9. The MOS transistor 15 has a gate connected to a node N2. A fuse element 16 is connected between the node N2 and the $V_{SS}$ power supply line 11. A resistor 17 is connected between the node N2 and the power supply terminal 8.

In the RAM chip 2, when the fuse elements 13 and 16 are not disconnected, both the MOS transistors 12 and 15 are turned on if a power-supply voltage $V_{CC}$ is applied between the power supply terminal 8 and the ground terminal 9, so that the power-supply voltage $V_{CC}$ is supplied to an MOS circuit 7.

On the other hand, when either of the fuse elements 13 and 16 is disconnected, the MOS transistor 12 and the MOS transistor 15 are turned off, so that the power-supply voltage $V_{CC}$ is not supplied to the MOS circuit 7.

Figure 6:
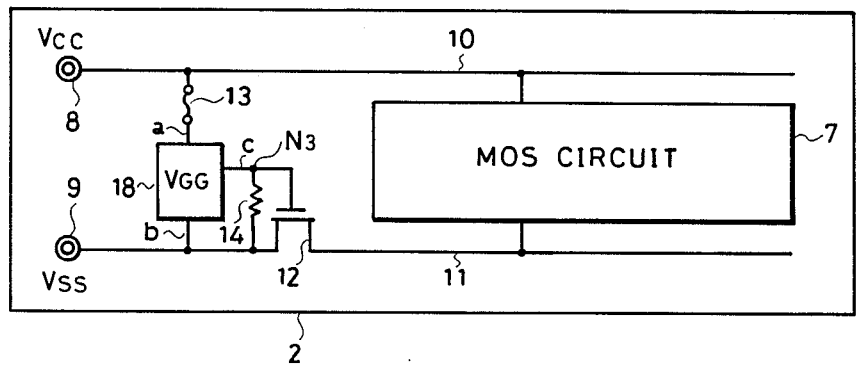
FIG. 6 is a circuit diagram showing one of semiconductor circuit chips included in a WSI semiconductor device according to a fourth embodiment of the present invention.

FIG. 6 is a circuit diagram showing one of semiconductor circuit chips included in a WSI semiconductor device according to a fourth embodiment of the present invention.

Referring to FIG. 6, an N channel MOS transistor 12 is connected between a ground terminal 9 and a $V_{SS}$ power supply line 11. The MOS transistor 12 has a gate connected to a node N3. A resistor 14 is connected between the node N3 and the ground terminal 9. The RAM chip 2 according to the present embodiment comprises a high voltage generating circuit 18 for generating a higher voltage $V_{GG}$ than a power-supply voltage $V_{CC}$. The high voltage generating circuit 18 has a $V_{CC}$ terminal a, a $V_{SS}$ terminal b, and a $V_{GG}$ terminal c for generating a high voltage $V_{GG}$. The $V_{CC}$ terminal a is connected to a power supply terminal 8 through a fuse element 13, the $V_{SS}$ terminal b is connected to the ground terminal 9, and the $V_{GG}$ terminal c is connected to the node N3.

Figure 7:
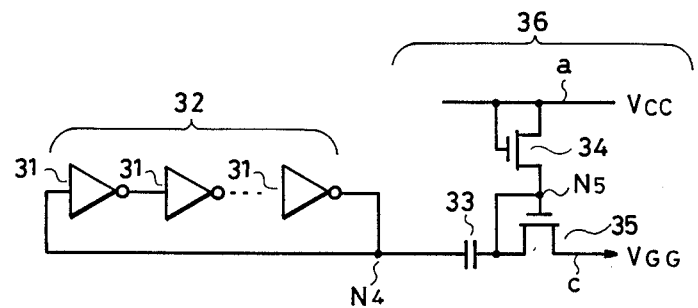
FIG. 7 is a circuit diagram showing a specific example of a high voltage generating circuit.

FIG. 7 is a circuit diagram showing a specific example of the high voltage generating circuit 18 shown in FIG. 6. The high voltage generating circuit 18 comprises a ring oscillator 32 comprising odd-numbered inverters 31 connected in series, and a charge pumping circuit 36 comprising a capacitor 33 and N channel MOS transistors 34 and 35. The charge pumping circuit 36 is responsive to an oscillating clock which is an output of the ring oscillator 32 for generating a voltage $V_{GG}$ at a higher level than that of a power-supply voltage $V_{CC}$. The capacitor 33 has an end connected to a node N4 which is an output terminal of the ring oscillator 32 and other end connected to a node N5 and a drain of the MOS transistor 35. The MOS transistor 35 has a source connected to a $V_{GG}$ terminal c and a gate connected to the node N5. The MOS transistor 34 has a gate and a drain connected to a $V_{CC}$ terminal a and a source connected to the node N5.

Figure 8:
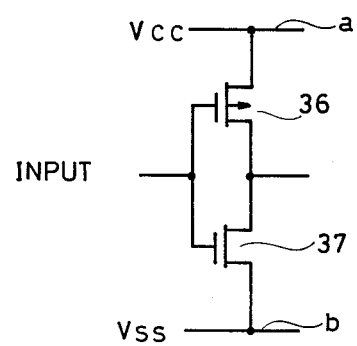
FIG. 8 is a circuit diagram showing a specific structure of an inverter included in the circuit shown in FIG. 7.

Each of the inverters 31 included in the above described ring oscillator 32 comprises a P channel MOS transistor 36 and an N channel MOS transistor 37, as shown in FIG. 8. The MOS transistor 36 has a drain connected to a $V_{CC}$ terminal a, and the MOS transistor 37 has a drain connected to a $V_{SS}$ terminal b. The MOS transistors 36 and 37 have gates connected to each other to be an input. The MOS transistors 36 and 37 have drains connected to each other to be an output.

Description is now made on operation of the high voltage generating circuit 18 shown in FIG. 7. Assuming that threshold voltages of the MOS transistors 34 and 35 are $V_{TH}$, the potential of the node N5 is ($V_{CC}-V_{TH}$) due to the MOS transistor 34 and the potential of the $V_{GG}$ terminal c is ($V_{CC}-2V_{TH}$) due to the MOS transistor 35 before the oscillating clock is applied from the ring oscillator 32. When the oscillating clock of the ring oscillator 32 rises, the potential of the node N5 is boosted above $V_{CC}$ by capacitive coupling of the capacitor 33. As a result, the MOS transistor 35 is turned on, so that current flows from the node N5 to the $V_{GG}$ terminal c. Therefore, the potential of the $V_{GG}$ terminal c is charged up until the potential difference between the $V_{GG}$ terminal c and the node N5 is $V_{TH}$ so that the MOS transistor 35 is turned off. When the oscillating clock falls, the potential of the node N5 drops by capacitive coupling of the capacitor 33. As a result, the MOS transistor 34 is turned on by the drop in potential, so that the node N5 is charged to be ($V_{CC}-V_{TH}$). The above described operation is repeated in response to a cycle of the oscillating clock. Every time the oscillating clock rises, the potential of the $V_{GG}$ terminal c rises by steps. Finally, the potential is boosted to a predetermined level $V_{GG}$ (theoretically $2(V_{CC}-V_{TH})$) in excess of the power-supply voltage $V_{CC}$. As shown in FIG. 6, since the output load of the high voltage generating circuit 18 is only the resistor 14 having a sufficiently high resistance value, the current consumption in the high voltage generating circuit 18 is extremely reduced. Thus, even if current is supplied to the high voltage generating circuit 18 through the fuse element 13, the fuse element 13 is not disconnected and the voltage drop can be neglected.

When the power-supply voltage $V_{CC}$ is applied between the power supply terminal 8 and the ground terminal 9 in the RAM chip 2, the power-supply voltage $V_{CC}$ is applied to the high voltage generating circuit 18 through the fuse element 13. Therefore, the high voltage generating circuit 18 operates, so that a higher voltage $V_{GG}$ than the power-supply voltage $V_{CC}$ is applied to the gate of the MOS transistor 12. As a result, since the MOS transistor 12 is sufficiently turned on so that the ground terminal 9 and the $V_{SS}$ power supply line 11 are electrically connected to each other, the power-supply voltage $V_{CC}$ applied between the power supply terminal 8 and the ground terminal 9 is supplied to the MOS circuit 7 without any voltage loss.

When the fuse element 13 is disconnected, the high voltage generating circuit 18 does not operate, so that a predetermined voltage is not applied to the gate of the MOS transistor 12. Thus, the MOS transistor 12 is turned off, so that the power-supply voltage $V_{CC}$ is not supplied to the MOS circuit 7.

Figure 9:
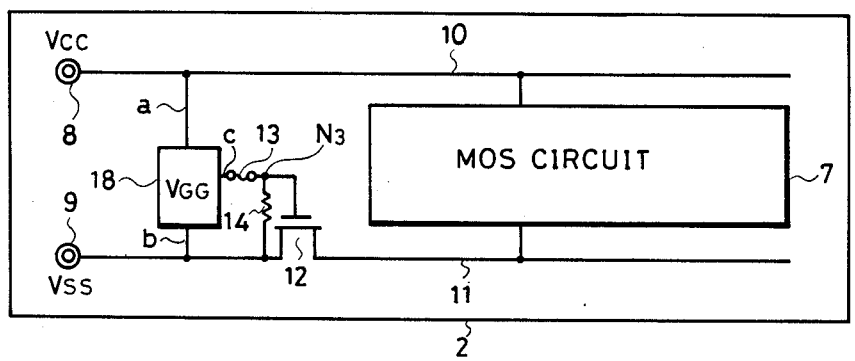
FIG. 9 is a circuit diagram showing one of semiconductor circuit chips included in a WSI semiconductor device according to a fifth embodiment of the present, invention.

FIG. 9 is a circuit diagram showing a single semiconductor circuit chip included in a WSI semiconductor device according to a fifth embodiment of the present invention.

The present embodiment of FIG. 9 is the same as the embodiment shown in FIG. 6 except that a fuse element 13 is connected between a $V_{GG}$ terminal c of a high voltage generating circuit 18 and a node N3, and a $V_{CC}$ terminal a of the high voltage generating circuit 18 is directly connected to a $V_{CC}$ power supply line 10. In the present embodiment, the MOS transistor 12 is turned off by disconnection of a fuse element 13, in which case the same effect as that of the embodiment shown in FIG. 6 is obtained.

Figure 10:
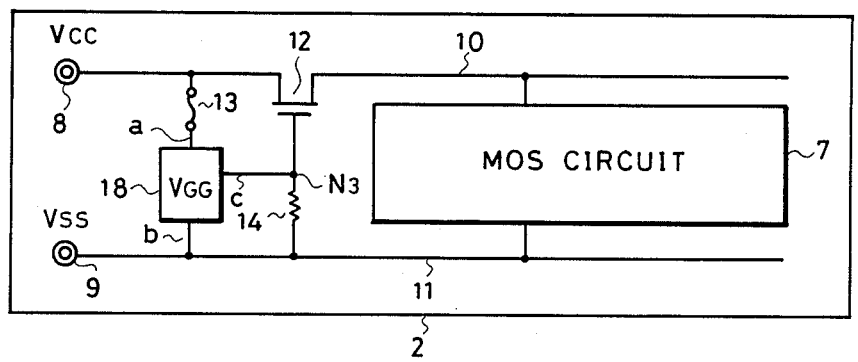
FIG. 10 is a circuit diagram showing one of semiconductor circuit chips included in a WSI semiconductor device according to a sixth embodiment of the present invention.

FIG. 10 is a circuit diagram showing one of semiconductor circuit chips included in a WSI semiconductor device according to a sixth embodiment of the present invention.

The present embodiment of FIG. 10 is the same as the embodiment shown in FIG. 6 except that an N channel MOS transistor 12 is connected between a power supply terminal 8 and a $V_{CC}$ power supply line 10, and the MOS transistor 12 has a gate connected to a node N3.

When a power-supply voltage $V_{CC}$ is applied between the power supply terminal 8 and a ground terminal 9 in an RAM chip 2, a high voltage generating circuit 18 operates, so that a higher voltage $V_{GG}$ than the power-supply voltage $V_{CC}$ is applied to the gate of the MOS transistor 12. Therefore, since the MOS transistor 12 is sufficiently turned on so that the power supply terminal 8 and the $V_{CC}$ power supply line 10 are electrically connected to each other, the power-supply voltage $V_{CC}$ applied between the power supply terminal 8 and the ground terminal 9 is supplied to an MOS circuit 7 without any voltage loss.

When a fuse element 13 is disconnected, the high voltage generating circuit 18 does not operate, so that a predetermined voltage is not applied to the gate of the MOS transistor 12. Therefore, the MOS transistor 12 is turned off, so that the power-supply voltage $V_{CC}$ is not supplied to the MOS circuit 7.

Figure 11:
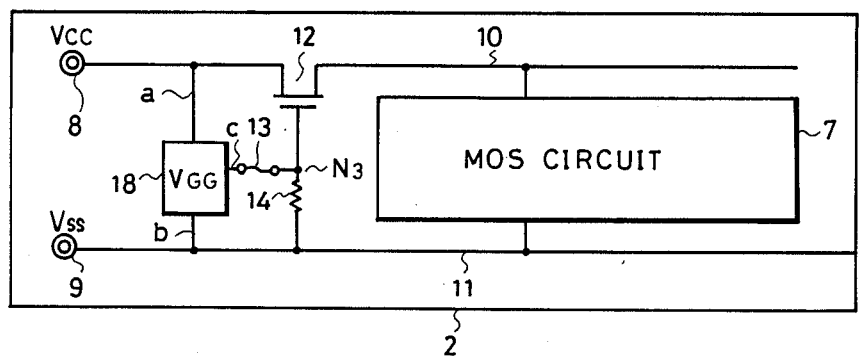
FIG. 11 is a circuit diagram showing one of semiconductor circuit chips included in a WSI semiconductor device according to a seventh embodiment of the present invention.

FIG. 11 is a circuit diagram showing one of semiconductor circuit chips included in WSI semiconductor device according to a seventh embodiment of the present invention.

The present embodiment of FIG. 11 is the same as the embodiment shown in FIG. 10 except that a fuse element 13 is connected between a $V_{GG}$ terminal c of a high voltage generating circuit 18 and a node N3, and a $V_{CC}$ terminal a of the high voltage generating circuit 18 is directly connected to a power supply terminal 8. In the present embodiment, the MOS transistor 12 is turned off by disconnection of the fuse element 13, in which case the same as that of the embodiment shown in FIG. 10 is obtained.

Although in any of the above described embodiments, an MOS transistor is used as switching means, the switching means is not limited to the same. For example, in an embodiment shown in FIG. 12, a bipolar transistor 21 serves as the switching means.

Figure 12:
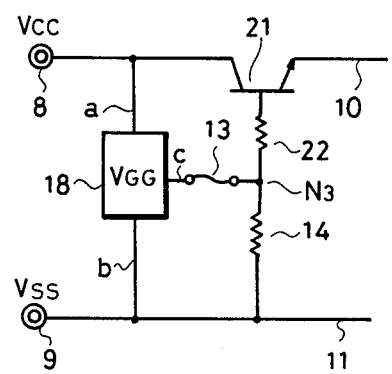
FIG. 12 is a circuit diagram showing one of semiconductor circuit chips included in a WSI semiconductor device according to a eighth embodiment of the present invention.

Referring to FIG. 12, the bipolar transistor 21 has a collector connected to a power supply terminal 8, an emitter connected to a $V_{CC}$ power supply line 10 and a base connected to a node N3 through a resistor 22. The structure of the other portions is the same as that in the embodiment shown in FIG. 11, in which case the same effect is obtained.

Although in the above described embodiments, a case was described in which the present invention is applied to a WSI semiconductor device comprising a plurality of RAM chips, it is needless to say that the present invention can be applied to a WSI semiconductor device comprising another semiconductor circuit chip such as a static RAM and ROM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a wafer scale integration semiconductor device comprising:
    a semiconductor wafer,
    a plurality of semiconductor circuit chips formed on said semiconductor wafer,
    a first common power supply terminal formed on said semiconductor wafer and coupled to a first power-supply voltage at a high level,
    a second common power supply terminal formed on said semiconductor wafer and coupled to a second power-supply voltage at a low level,
    a first common power supply interconnection connected between said first common power supply terminal and said plurality of semiconductor circuit chips, and
    a second common power supply interconnection connected between said second common power supply terminal and said plurality of semiconductor circuit chips, the improvement comprising:
    a switch means having a control terminal connected between at least one of said first and said second common power supply interconnections and one of said semiconductor circuit chips.
    a switching control means including a fuse means for rendering said switching means conductive when said fuse means is not disconnected and rendering said switching means nonconductive when said fuse means is disconnected, and
    a voltage source means for applying a predetermined voltage to said control terminal for rendering said switching element conductive.

2. In a wafer scale integration semiconductor device as recited in claim 1, the improvement further comprising
    said voltage source means includes a terminal for application of said predetermined voltage to said wafer.

3. In a wafer scale integration semiconductor device as recited in claim 1, the improvement further comprising
    said voltage source means includes voltage converter means connected to said first power supply and producing said predetermined voltage.

4. In a wafer scale integration semiconductor device as recited in claim 3, the improvement further comprising
    at least one said voltage converter means and at least one corresponding one of said switching means being integrated on one said chip of said wafer scale integration semiconductor device.

5. A wafer scale integration semiconductor device comprising:
    a semiconductor wafer,
    a plurality of semiconductor circuit chips formed on said semiconductor wafer,
    a first common power supply terminal formed on said semiconductor wafer and coupled to a first power-supply voltage at a high level,
    a second common power supply terminal formed on said semiconductor wafer and coupled to a second power-supply voltage at a low level,
    a first common power supply interconnection connected between said first common power supply terminal and said plurality of semiconductor circuit chips, and
    a second common power supply interconnection connected between said second common power supply terminal and said plurality of semiconductor circuit chips,
    each of said semiconductor circuit chips comprising
    an internal circuit comprising a first chip power supply interconnection and a second chip power supply interconnection,
    a first chip power supply terminal for supplying said first power-supply voltage applied from said first common power supply interconnection to said first chip power supply interconnection,
    a second chip power supply terminal for supplying said second power-supply voltage applied from said second common power supply interconnection to said second chip power supply interconnection,
    switching means connected between said first chip power supply terminal and said first chip power supply interconnection and/or between said second chip power supply terminal and said second chip power supply interconnection,
    switching control means including fuse means for rendering said switching means conductive when said fuse means is not disconnected and for rendering said switching means nonconductive when said fuse means is disconnected,
    wherein said switching means comprises a switching element comprising one conduction terminal connected to said first or second chip power supply terminal, the other conduction terminal connected to said first or second chip power supply interconnection and a control terminal connected to said switching control means, and
    wherein said switching control means is connected between said first chip power supply terminal and said second chip power supply and includes a voltage source means for applying a predetermined voltage to said control terminal in said switching element terminal for rendering said switching element conductive through said fuse means,
    whereby one of said first and second power-supply voltages is applied to at least one said chip of said wafer scale integration semiconductor device.

6. A wafer scale integration semiconductor device according to claim 5, wherein said switching control means applies a power-supply voltage applied to either of said first and second chip power supply terminals, to which said switching element is not connected, to said control terminal in said switching element through said fuse means, said switching element being rendered conductive when said power-supply voltage is applied to said control terminal by said switching control means.

7. A wafer scale integration semiconductor device according to claim 6, wherein said switching control means comprises resistor means connected between said control terminal and said one conduction terminal in said switching element and having a high resistance value.

8. A wafer scale integration semiconductor device according to claim 7, wherein said switching element comprises an N channel MOS field effect transistor connected between said second chip power supply terminal and said second chip power supply interconnection and having a gate terminal connected to said first chip power supply terminal through said fuse means.

9. A wafer scale integration semiconductor device according to claim 7, wherein said switching element comprises a P channel MOS field effect transistor connected between said first chip power supply terminal and said first chip power supply interconnection and having a gate terminal connected to said second chip power supply terminal through said fuse means.

10. A wafer scale integration semiconductor device according to claim 5, wherein said switching control means comprises high voltage generating means having a first terminal coupled to said first power-supply voltage, a second terminal coupled to said second power-supply voltage and a high voltage terminal for generating a high voltage at a higher level than that of said first power-supply voltage, said switching element being rendered conductive when said high voltage is applied to said control terminal by said high voltage generating means.

11. A wafer scale integration semiconductor device according to claim 10, wherein said switching control means comprises resistor means connected between said control terminal in said switching element and said second chip power supply terminal and having a high resistance value.

12. A wafer scale integration semiconductor device according to claim 11, wherein said switching element comprises an N channel MOS field effect transistor connected between said second chip power supply terminal and said second chip power supply interconnection and having a gate terminal coupled to said high voltage from said high voltage generating means.

13. A wafer scale integration semiconductor device according to claim 11, wherein said switching element comprises an N channel MOS field effect transistor connected between said first chip power supply terminal and said first chip power supply interconnection and having a gate terminal coupled to said high voltage from said high voltage generating means.

14. A wafer scale integration semiconductor device according to claim 11, wherein said switching element comprises a bipolar transistor connected between said first chip power supply terminal and said first chip power supply interconnection and having a base terminal coupled to said high voltage from said high voltage generating means.

15. A wafer scale integration semiconductor device according to claim 10, wherein said fuse means is connected between said first chip power supply terminal and said first terminal of said high voltage generating means.

16. A wafer scale integration semiconductor device according to claim 10, wherein said fuse means is connected between said high voltage terminal of said high voltage generating means and said control terminal in said switching element.

17. A wafer scale integration semiconductor device according to claim 10, wherein said high voltage generating means comprises a ring oscillator including odd-numbered inverters and a charge pumping circuit including a plurality of MOS field effect transistors and a capacitor.

18. A wafer scale integration semiconductor device according to claim 5, wherein said fuse means comprises a fuse element which can be disconnected by laser.

* * * * *